(12) United States Patent
Grollitsch

(10) Patent No.: US 10,326,456 B2
(45) Date of Patent: Jun. 18, 2019

(54) PHASE COMBINER CIRCUIT

(71) Applicant: Infineon Technologies AG, Neubiberg (DE)

(72) Inventor: Werner Grollitsch, Villach (AT)

(73) Assignee: Infineon Technologies AG, Neubiberg (DE)

( * ) Notice: Subject to any disclaimer, the term of this patent is extended or adjusted under 35 U.S.C. 154(b) by 28 days.

(21) Appl. No.: 15/495,521

(22) Filed: Apr. 24, 2017

(65) Prior Publication Data

US 2018/0309456 A1  Oct. 25, 2018

(51) Int. Cl.
*H03K 5/00* (2006.01)
*H03L 7/085* (2006.01)

(52) U.S. Cl.
CPC ......... *H03L 7/085* (2013.01); *H03K 5/00006* (2013.01)

(58) Field of Classification Search
CPC . G11C 7/00; G11C 7/222; H03K 3/00; H03K 3/037; H03L 7/00; H03L 7/0805; H03L 7/0812; H03L 7/0814; H03L 7/085; H03L 7/087
USPC .......................................................... 327/158
See application file for complete search history.

(56) References Cited

U.S. PATENT DOCUMENTS

| 6,404,572 B1* | 6/2002 | Hong | G11B 20/10009 360/45 |
|---|---|---|---|
| 2007/0030041 A1* | 2/2007 | Huang | H03K 5/133 327/158 |
| 2007/0200609 A1* | 8/2007 | Kang | G01R 31/31727 327/296 |
| 2009/0086553 A1* | 4/2009 | Lee | G11C 7/1006 365/189.08 |
| 2013/0207701 A1* | 8/2013 | Kitagawa | H03K 5/06 327/158 |

OTHER PUBLICATIONS

Mesgarzadeh, et al., "A 2-GHz 7-mW Digital DLL-Based Frequency Multiplier in 90-nm CMOS," Sep. 15-19, 2008, Solid-State Circuits Conference, 2008. ESSCIRC 2008. 34th European, IEEE, pp. 86-89.
Qazi, et al., "Proposed Architecture for Low Power and Area Efficient Edge Combiner," International Journal of Technology and Research, vol. 1, No. 2, 2013, pp. 45-48.
Li, "High-Speed Clocking Deskewing Architecture," Master Thesis, University of Waterloo, Ontario, Canada, May 2007, 92 pp.
Lim et al. "A Delay Locked Loop with a Feedback Edge Combiner of Duty-Cycle Corrector with a 20%-80% Input Duty Cycle for SDRAMs," IEEE Transactions on Circuits and Systems-II: Express Briefs, vol. 63, No. 2, Feb. 2016, pp. 141-145.

* cited by examiner

*Primary Examiner* — Lincoln D Donovan
*Assistant Examiner* — Dave Mattison
(74) *Attorney, Agent, or Firm* — Shumaker & Sieffert, P.A.

(57) ABSTRACT

Methods and devices are discussed where a plurality of input signals having different phases are provided. From the input signals, a plurality of signal pairs are selected, and intermediate signals are generated based on the signal pairs. The intermediate signals are then combined.

20 Claims, 6 Drawing Sheets

PHASE COMBINER CIRCUIT

TECHNICAL FIELD

The present application relates to phase combiner circuits and to corresponding methods.

BACKGROUND

Phase combiner circuits are used for frequency multiplication, in particular for generating output clock signals having a higher frequency than an input clock signal. In such phase combiner circuits, conventionally a plurality of signals having a same frequency, but different phases are generated, for example using a delay locked loop (DLL) delaying an input signal or using a ring oscillator. This plurality of signals having different phases is then combined to form an output signal having a higher frequency.

Conventional ways for combining the plurality of signals having different phases include dynamically switching multiplexers, where one of the plurality of signals is forwarded to an output of the multiplexer in each clock cycle, for example controlled by a counter. This requires a fast switching of the multiplexer in each clock cycle. Another conventional approach uses a static chain of logic gates, for example exclusive OR (XOR) gates. Such approaches are usually prone to duty cycle distortions of the input signal and could even potentially lead to glitches on an output signal, for example, if a duty cycle is degrading over a delay line used for generating the input signals having the plurality of phases. For duty cycle correction or adjustment, additional circuits have to be used like current starved buffers or inverters, which require a control of transistor currents for duty cycle adjustment.

SUMMARY

According to an embodiment, a device is provided, comprising:

a signal generator configured to generate a plurality of signals having different phases, a selection circuit configured to select a plurality of signal pairs from the plurality of signals, and a phase combiner circuit, wherein the phase combiner circuit is configured to generate a plurality of intermediate signals, each intermediate signal being based on one of the plurality of pairs such that a first signal of the respective pair determines rising edges of the respective intermediate signal and a second signal of the respective pair defines falling edges of the respective intermediate signal, and to combine the plurality of intermediate signals to form an output signal.

According to another embodiment, a device is provided, comprising:

a delay locked loop configured to provide a plurality of input signals having different phases based on a reference signal, a multiplexer configured to select at least one pair of signals from the plurality of input signals, for each of the at least one pair, a D flip-flop, wherein a clock input of the D flip-flop is configured to receive a first signal of the respective pair and a reset input of the D flip-flop is configured to receive a second signal of the respective pair via an inverter.

According to another embodiment, a method is provided, comprising:

providing multiple input signals having different phases, selecting a plurality of signal pairs from the input signals, forming a plurality of intermediate signals, each intermediate signal based on one of the plurality of signal pairs, wherein each intermediate signal is formed such that rising edges of the respective intermediate signals are based on a first signal of the respective pair and falling edges of the respective intermediate signal are based on the second signal of the respective pair, and combining the intermediate signals.

The above summary is merely intended to give a brief overview over some embodiments and is not to be construed as limiting. Other embodiments use other features or elements than the ones explicitly discussed above.

DETAILED DESCRIPTION

In the following, various embodiments will be described in detail referring to the attached drawings. These embodiments are given by way of example only and are not to be construed as limiting. For example, while embodiments may be described comprising numerous details, features or elements, in other embodiments some of these details, features or elements may be omitted and/or may be replaced by alternative features, details or elements. In addition to the features, elements or details explicitly shown and described herein, other features, elements or details, for example features, elements or details used in conventional phase combiner circuits and clock generating circuits, may be employed. Features, elements or details from different embodiments may be combined with each other unless noted otherwise. Modifications and variations discussed with respect to one of the embodiments are also applicable to other embodiments.

In the embodiment shown and described any direct electrical connection or coupling, i.e. connection or coupling without intervening elements like a simple wire or metal path connection, may also be implemented by an indirect connection or coupling, i.e. a connection or coupling with one or more additional intervening elements, and vice versa as long as the general purpose and function of the connection or coupling, for example to transmit a certain kind of signal or information or to provide a certain kind of control, is essentially maintained. In other words, electrical connections and couplings shown may be modified as long as the general function of the connection or coupling is essentially preserved.

Figure 1:
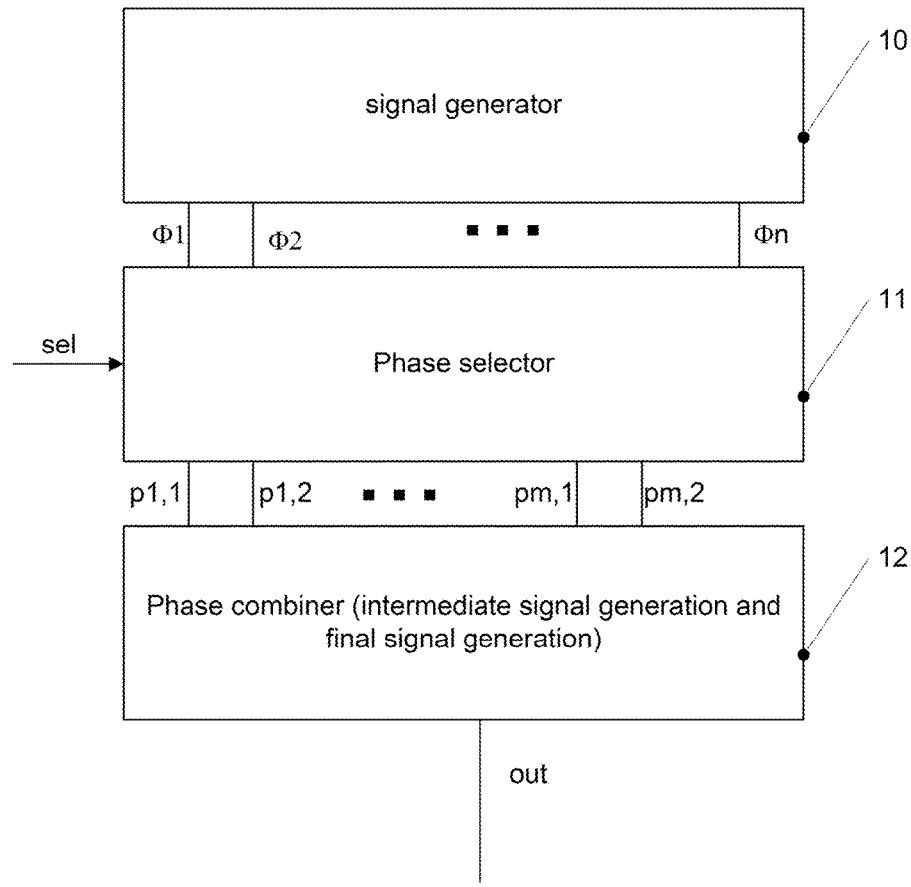
FIG. 1 is a block diagram of a device according to an embodiment.

Turning now to the Figures, FIG. 1 is a block diagram illustrating a device according to an embodiment. The Embodiment of FIG. 1 includes a signal generator 10 configured to generate a plurality of signals $\phi 1, \phi 2, \ldots \phi n$, when n is an integer number greater than 1, for example 4 or more. In embodiments, signals ϕ1, ϕ2 ..., ϕn have a same frequency, but different phases. For example, the phase offset from one of the signals to the next signal (i.e. from ϕ1 to ϕ2, from ϕ2 to ϕ3, ..., from ϕn to ϕ1) may be 360°/n. In other embodiments, other phase offsets may be used.

To generate signals ϕ1, ϕ2, ... ϕn, signal generator 10 may for example comprise a delay locked loop (DLL) to generate the signals ϕ1 to ϕn from a clock signal by delaying the clock signal, or a delay chain without regulation, i.e. a plurality of delay elements (for example inverters), coupled in series. In other embodiments, a ring oscillator may be used to generate signals ϕ1 to ϕn. Other conventional approaches for generating a plurality of signals having defined phase offsets may also be used.

Signals ϕ1 to ϕn are provided to a phase selector circuit 11, for example a multiplexer, which selects m pairs, m being an integer greater than 1, of signals from signals ϕ1 to ϕn based on a selection signal sel. In the example shown, a first pair, p1,1 and p1,2 and m-th pair pm,1, pm,2 are shown. Each of signals p1,1, p1,2, ... pm,1, pm,2 may be one of signals ϕ1 to ϕn.

The selected signal pairs are then provided to a phase combiner 12. From each selected pair, phase combiner 12 generates an intermediate signal. In one embodiment, a first signal of each pair (p1,1 ... pm,1) determines the rising edges of the respective intermediate signal, and the second signal (p1,2 ... pm,2) of each pair determines falling edges of the respective intermediate signal. In particular, in some implementations rising edges of the first signal of each pair correspond to rising edges of the respective intermediate signal, and rising edges of the second signal of each pair correspond to falling edges of the respective intermediate signal. In such an embodiment where the rising edges of the signals p1,1 ... pm,2 and therefore signals ϕ1 to ϕn are used, an influence of skew distortions or duty cycle variations of signals ϕ1 to ϕn on an output signal may be reduced.

Phase combiner 12 furthermore then combines the intermediate signals to a final signal for example by a logic gate like an OR gate. Depending on the selection of signals ϕ1 to ϕn in phase selector 11 and on the number of pairs selected, output signals with different frequencies and/or other desired properties like duty cycle may be obtained, as will be explained further below in greater detail using some non-limiting examples.

Figure 2:
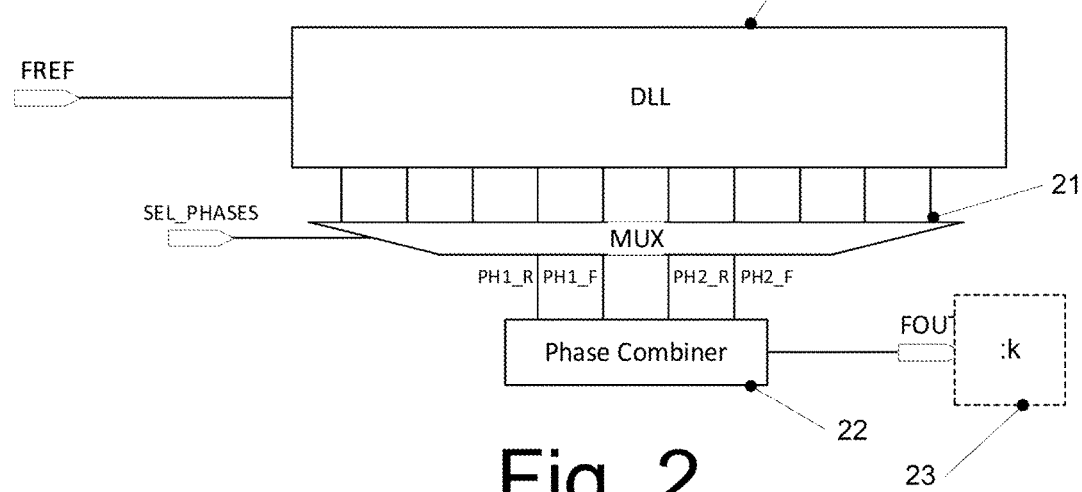
FIG. 2 is a block diagram of a device according to another embodiment.

FIG. 2 is a block diagram of a device according to a further embodiment. The device of FIG. 2 comprises a delay locked loop (DLL) 20 as an example for a signal generator, which DLL receives a reference clock signal Fref. Based on reference clock signal Fref, DLL 20 generates a plurality of signals having defined phase offsets between them. These signals are provided to a multiplexer 21. Based on a selection signal sel_phases, multiplexer 21 selects a plurality of pairs of signals from the signals generated by DLL 20, in the example of FIG. 2 a first pair PH1_R, PH1_F and a second pair PH2_R, PH2_F. These two pairs of signals are provided to a phase combiner 22. Phase combiner 22 generates a first intermediate signal based on the first pair PH1_R, PH1_F such that the rising edges of the first intermediate signal corresponds to rising edges of PH1_R and falling edges of the first intermediate signal correspond to rising edges of PH1_F. Furthermore, phase combiner 22 generates a second intermediate signal based on the second pair PH2_R, PH2_F such that rising edges of the second intermediate signal correspond to rising edges of PH2_R and falling edges of the second intermediate signal correspond to rising edges of PH2_F. Phase combiner 22 then combines the first and second intermediate signals to generate an output signal Fout. In some implementations, Fout may have a higher frequency than Fref, for example twice the frequency of Fref in case two pairs of signals are selected as shown in FIG. 2, or three times the frequency of Fref in case three pairs are selected in other embodiments.

Optionally, signal Fout may then be provided to further circuits. As an example, a frequency divider 23 is shown which divides the frequency of Fout by k, for example by 2. As will be explained below using examples, by providing such a frequency divider a duty cycle of a signal may be adjusted using the device of FIG. 2.

Figure 3:
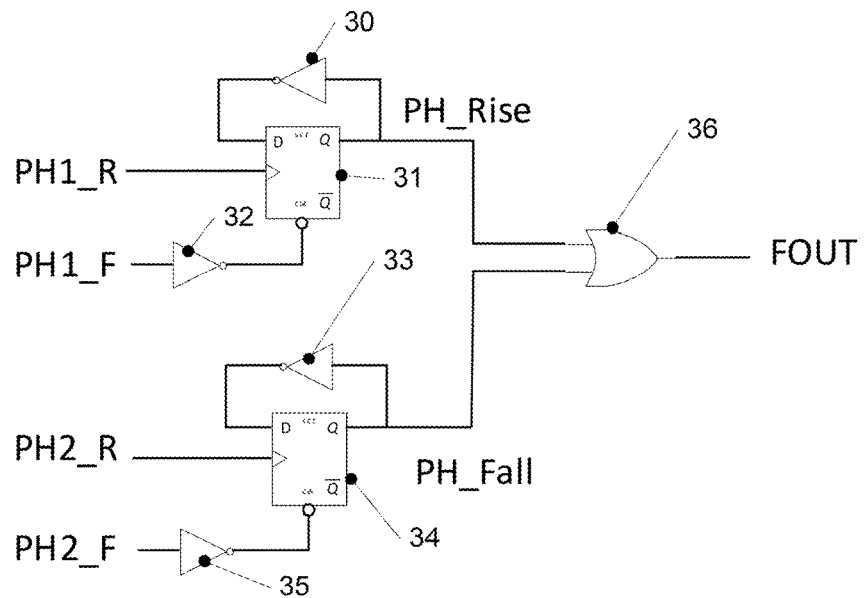
FIG. 3 is a circuit diagram of a phase combiner circuit according to an embodiment.

FIG. 3 illustrates an example of a phase combiner circuit usable for example as phase combiner circuit in the embodiment of FIGS. 1 and 2. The example of FIG. 3 uses two pairs of selected input signals, a first pair PH1_R, PH1_F and a second pair PH2_R, PH2_F. These signals, as for example shown in FIG. 2, may be selected from a plurality of signals having different phases.

PH1_R in the embodiment of FIG. 3 is provided to a clock input of a D flip-flop 31. Furthermore, signal PH1_F is provided to a low active reset input of D flip-flop 31 via an inverter 32. A non-inverting output (Q) of D flip-flop 31 outputs a first intermediate signal PH_Rise and is additionally provided to a data input D of D flip-flop 31 via an inverter 30.

Elements 33 to 35 correspond to elements 30 to 32, respectively for the second pair PH_R, PH_F as shown in FIG. 3 and output a second intermediate signal PH_Fall. The first and second intermediate signals PH_Rise, PH_Fall are combined in an OR gate 36 to form signal Fout.

In operation, rising edges of PH1_R cause the output of D flip-flop 31 go to high, leading to a rising edge of PH_Rise. A following rising edge of PH1_F resets D flip-flop 31 via inverter 32 leading to a falling edge of signal PH_Rise. Likewise, rising edges of PH_R cause rising edges of PH_Fall, and rising edges of PH2_F cause falling edges of PH_Fall.

Example for the operation of the device of FIG. 2 provided with the phase combiner of FIG. 3 will now be discussed referring to FIGS. 4-6. In each of FIGS. 4-6, ten signals PH0 to PH9 are shown which have a same frequency and a same duty cycle, but different phases offset by respective phase offsets 360°/10 as shown in FIGS. 4-6.

Figure 4:
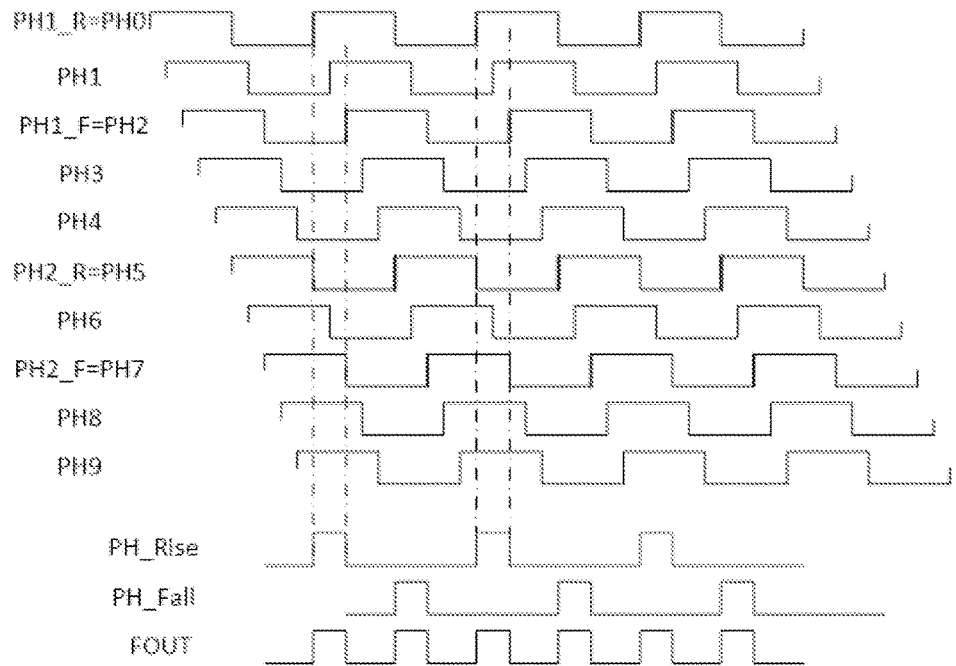
FIGS. 4-6 show illustrative example signals according to some embodiment.

In the example of FIG. 4, signal PH0 is selected as PH1_R and signal PH2 is selected as PH1_F, i.e. as signals of a first pair. As signals of a second pair, PH5 is selected as PH2_R and PH7 is selected as PH2_F. As indicated by dashed lines in FIG. 4, this selection using the phase combiner of FIG. 3 leads to first and second intermediate signals PH_Rise and PH_Fall with pulses having a phase offset of half a period of each of signals PH_Rise, PH_Fall with respect to each other, i.e. 180°. Combining these signals PH_Rise and PH_Fall by an OR gate, a signal Fout as shown in FIG. 4 results, which has twice the frequency of each of signals PH0 to PH0. In this way, a frequency doubling is obtained in the example of FIG. 4.

Figure 5:
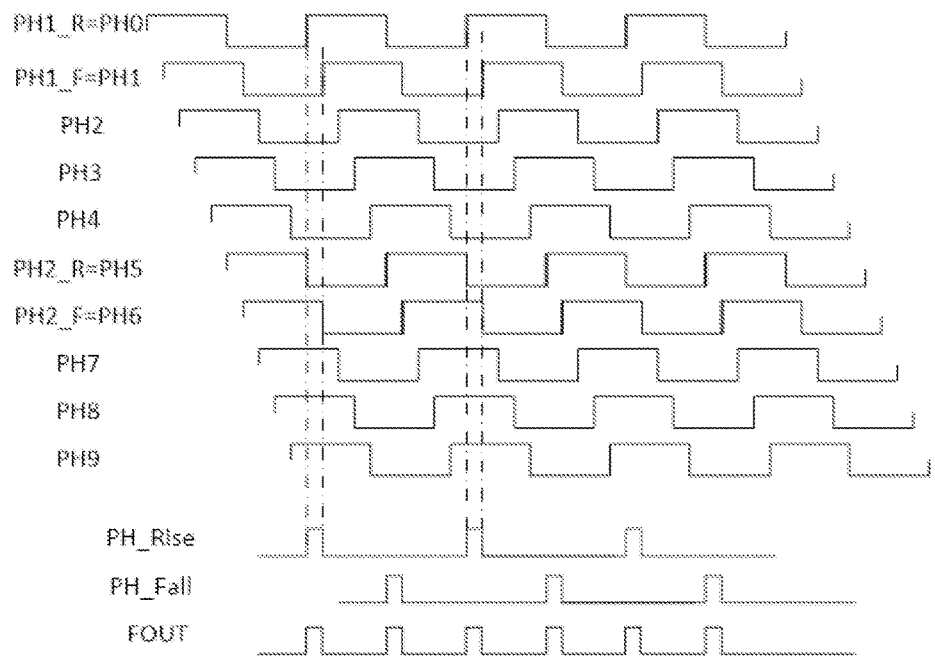

A further example is illustrated in FIG. 5. Here, as signals PH1_R and PH1_F signals PH0 and PH1 are selected, and as signals PH2_R and PH2_F signals PH5 and PH6 are selected. In other words, here the signals of each pair are adjacent to each other, in contrast to FIG. 4 where a signal was in between two signals selected for a pair (for example PH1 between PH0 and PH2 selected as PH1_R and PH1_F, respectively). As shown in FIG. 5, this leads to signals PH_Rise and PH_Fall having a smaller duty cycle (smaller high time) as in case of FIG. 4, and hence also to a combined signal Fout having a smaller duty cycle than signal Fout in FIG. 4. Therefore, in an embodiment like the one described with reference to FIGS. 2 and 3, by the signal selection a duty cycle may be adjusted.

Figure 6:
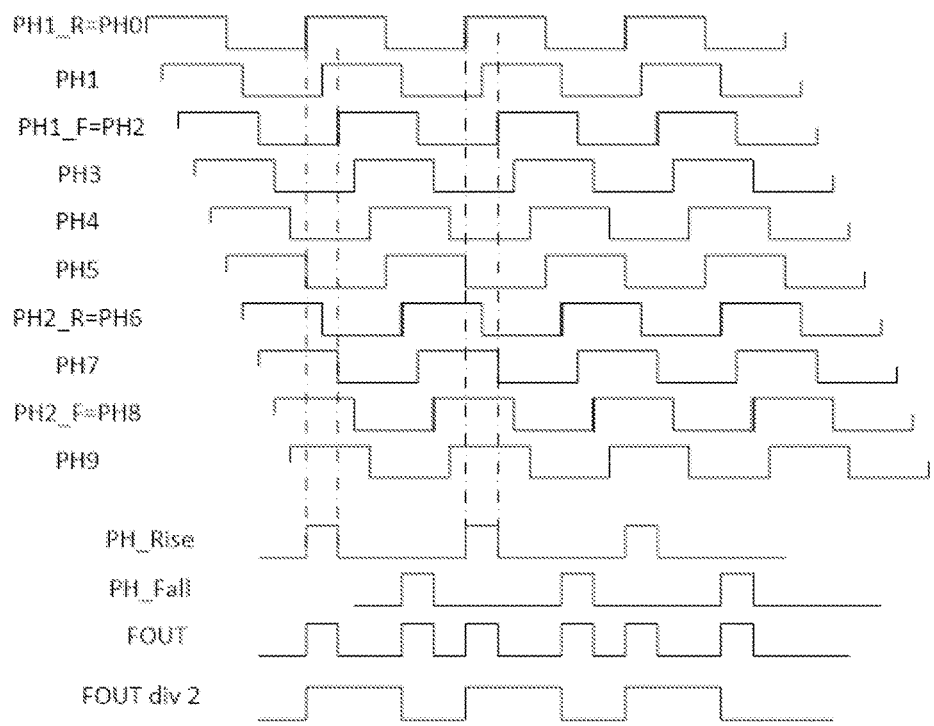

FIG. 6 illustrates a further example. Here, as first pairs PH1_R, PH1_F signals PH0 and PH2 are selected (similar to FIG. 4), and as second pair PH2_R, PH2_F signals PH6 and PH7. This results in intermediate signals PH_Rise, PH_Fall which are not offset to each other by half a period, and to a combined signal Fout with irregularly spaced pulses. If this signal Fout is divided by two by a frequency divider (for example divider 23 of FIG. 2), a signal Fout div2 as shown in FIG. 6 results which has the same frequency as signals PH0 to PH9, but a greater duty cycle (longer high time). Therefore, in some embodiments by using a frequency divider a duty cycle of a clock signal may be adjusted without frequency multiplication.

Figure 7:
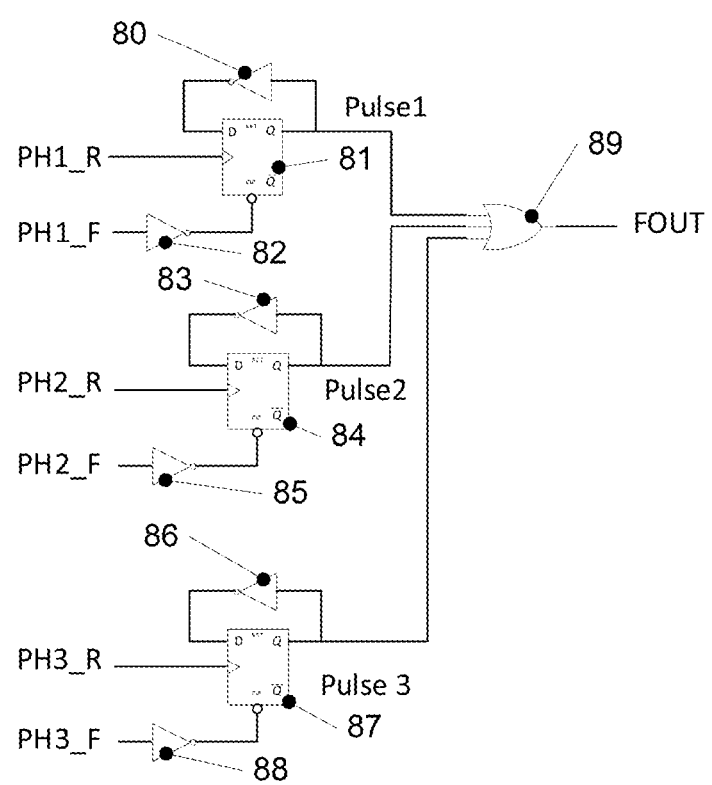
FIG. 7 is a circuit diagram of a phase combiner circuit according to an embodiment.

In the embodiment of FIG. 3, two signal pairs PH1_R, PH1_F and PH2_R, PH2_F are selected and combined. In other embodiments, more than two signal pairs may be used. As an example, FIG. 7 illustrates a phase combiner circuit for three pairs of signals, a first pair PH1_R, PH1_F, a second pair PH2_R, PH2_F and a third pair PH3_R and PH3_F. The first pair PH1_R, PH1_F is processed by elements 80-82 to form a first intermediate signal Pulse1, the second pair PH2_R, PH2_F is processed by elements 83-85 to form a second intermediate signal Pulse2, and the third pair PH3_R, PH3_F is processed by elements 86-88 to form a third intermediate signal Pulse3. Each of elements 80-82, 83-85 and 86-88 are configured as described for elements 30-32 with respect to FIG. 3 and operate accordingly, i.e. comprise a D flip-flop and two inverters. Therefore, this operation will not be described again in greater detail.

The first to third intermediate signals Pulse1, Pulse2 and Pulse3 are combined in a triple OR gate 89 to an output signal Fout.

Figure 8:
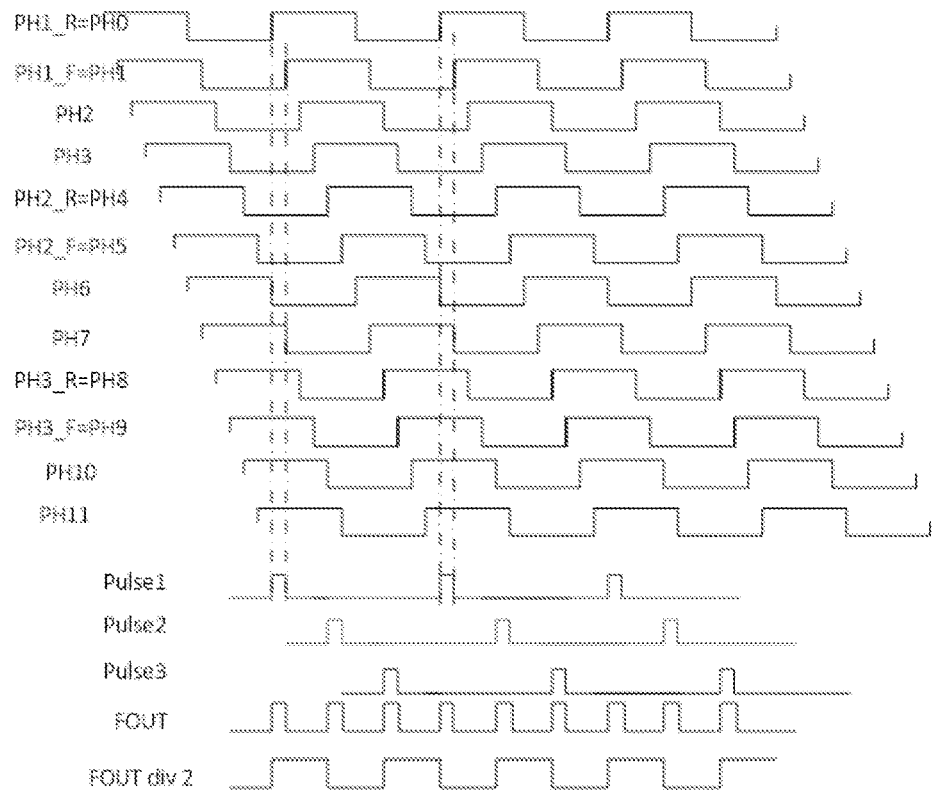
FIG. 8 illustrates example signals of some embodiments.

An example for the operation of the phase combiner circuit of FIG. 7 is shown in FIG. 8. In the example of FIG. 8, a signal generator like signal generator 10 of FIG. 1 or DLL 20 of FIG. 2 generates 12 signals PH0 to PH11 having equal phase offsets as shown in FIG. 8, each phase offset being 360°/12=30°. In the example of FIG. 8 as first signal pair PH1_R, PH1_F PH0 and PH1 are selected, as second signal pair PH2_R, PH2_F PH4 and PH5 are selected, and as third signal PH3_R, PH3_F PH8 and PH9 are selected. Therefore, the signal pairs in FIG. 8 are equally distant from each other in phase. Other selections are also possible. This results in intermediate signals Pulse1, Pulse2 and Pulse3 as shown, having pulses offset to each other by 120° from one signal to the next (i.e. from Pulse1 to Pulse2 and Pulse2 to Pulse3). The resulting signal Fout has a frequency three times the frequency of each of signals PH0 to PH11, thus achieving a frequency multiplication by three. If a frequency divider by two is employed dividing signal Fout, a signal Fout div2 having 3/2 times the frequency of each of PH0 to PH11 is generated. Generally, if m intermediate signals are used and a frequency division by k is used, a frequency multiplication by m/k may be obtained in some embodiments.

Therefore, as can be seen with devices according to some embodiments a frequency of an output signal and/or a duty cycle thereof may be adjusted.

Figure 9:
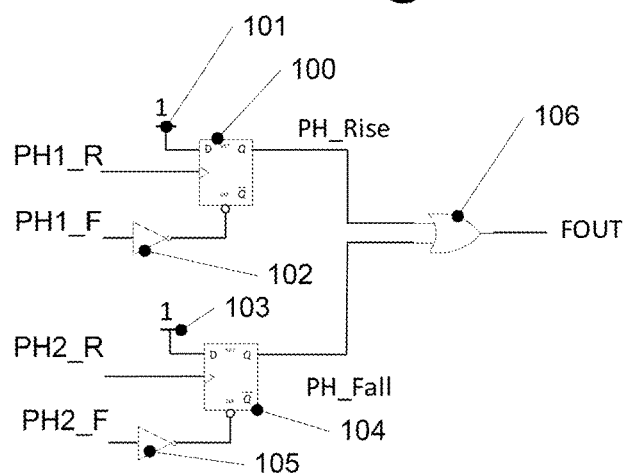
FIG. 9 is a circuit diagram of a phase combiner circuit according to an embodiment.

FIG. 9 illustrates an alternative implementation of a phase combiner circuit according to an embodiment. In FIG. 9, similar to what was described with respect to FIG. 3 two signal pairs PH1_R, PH1_F and PH2_R, PH2_F are used, these signals being for example selected from a plurality of phase signals generated by a signal generator like a DLL, a delay chain or a ring oscillator, as explained.

The operation of the circuit of FIG. 9 is similar to the circuit of FIG. 3, and for ease of understanding reference will be made to the description of FIG. 4 when describing the circuit of FIG. 9. However, it is to be understood that the circuit of FIG. 9 may be implemented independently from the circuit of FIG. 3.

In the phase combiner circuit of FIG. 9, signal PH1_R is provided to a clock input of a D flip-flop 100, and signal PH1_F is applied to a low active reset input of D flip-flop 100 via an inverter 102. At an output (Q) of D flip-flop 100, a first intermediate signal PH_Rise is output. In contrast to FIG. 4, this signal is not fed back to the data input D via an inverter, but as indicated by 101 a permanent logic 1 is provided to the data input of D flip-flop 100.

In a similar manner, signal PH2_R is provided to a clock input of D flip-flop 104, signal PH2_F is provided to a reset input of D flip-flop 104 via an inverter 105, and a logic 1 as indicated at 103 is provided to a data input D of D flip-flop 104. A second intermediate signal PH_Fall is output from a non-inverting output (Q) of D flip-flop 104. Intermediate signals PH_Rise, PH_Fall are combined in an OR gate 106 to form output signal Fout.

The behavior of the circuit of FIG. 9 is similar to the behavior of the circuit of FIG. 3 and the non-limiting examples given in FIGS. 4-6 may also be applicable to the circuit of FIG. 9. Furthermore, while the circuit of FIG. 9 is provided for two pairs of input signals, it may be extended to a greater number of input signals, for example three input signals, as was already explained for the circuit of FIG. 3 referring to FIG. 7.

Therefore, as can be seen, various possibilities exist for implementing phase combiner circuits. For example, instead of D flip-flops, other types of flip-flops or latches may be used.

Figure 10:
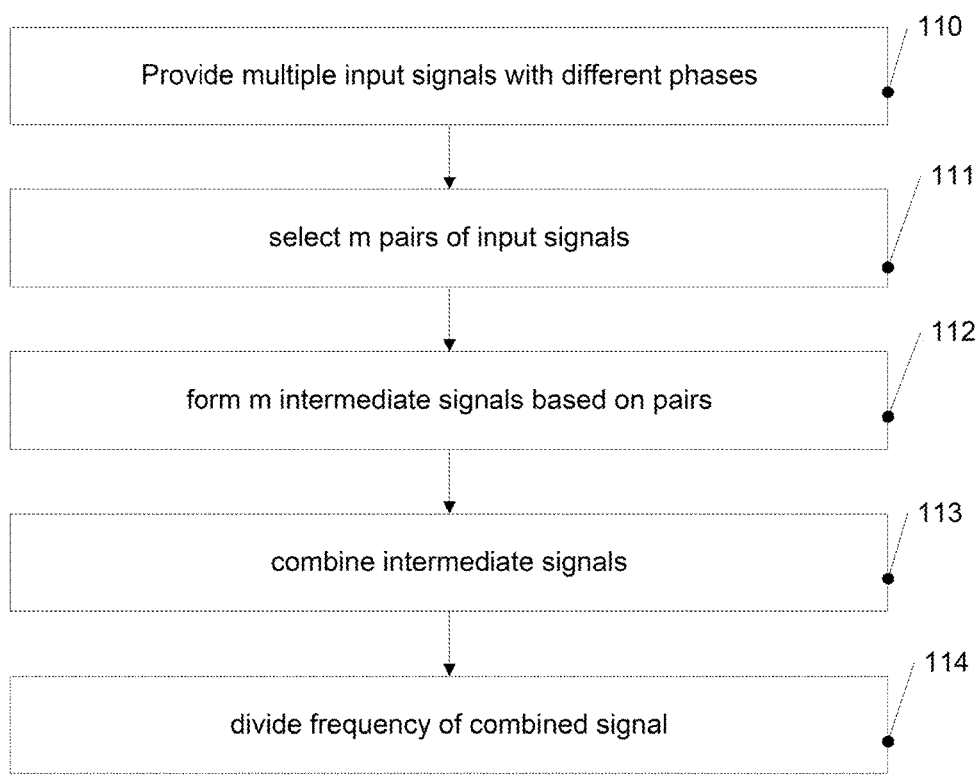
FIG. 10 is a flowchart illustrating a method according to an embodiment.

FIG. 10 is a flow chart illustrating a method according to an embodiment. While the method of FIG. 10 is shown and will be described as a series of acts or events, the order in which these acts or events are described is not to be construed as limiting. The method of FIG. 10 may be implemented using the devices discussed previously, but is not limited thereto. Nevertheless, for ease of understanding when describing the method of FIG. 10, reference will be made to the previously discussed embodiments for illustration purposes only.

At 110, the method comprises providing multiple input signals with different phases, for example using a delay locked loop, a ring oscillator or a delay line or any other signal generator, for example signal generator 10 of FIG. 1 or DLL 20 of FIG. 2.

At 111, the method comprises selecting m pairs of input signals, where m is at least 2. This selection may be effected by a multiplexer like multiplexer 21 of FIG. 2 or any other selection circuit like selection circuit 11 of FIG. 1. At 112, the method comprises forming m intermediate signals based on the pairs selected at 111, such that for each intermediate signal one input signal of the pair (for example rising edges thereof) determine rising edges of the intermediate signal and the other signal of the pair (for example rising edges thereof) defines falling edges of the intermediate signals. For example, phase combiner circuits as shown in FIG. 3, 7 or 9 may be used for this forming of intermediate signals, but the method of FIG. 10 is not limited thereto.

At 113, the method comprises combining the intermediate signal, for example by using a logic gate like an OR gate, to form a combined signal. In some embodiments, this combined signal may be used as an output signal. In other embodiments, optionally at 114 the frequency of the combined signal may be divided by a factor k, for example k=2, for example using frequency divider 23 of FIG. 2. In some embodiments, by using the method of FIG. 10 at 113 an output signal having m times the frequency of the input signals may be provided, and/or at 114 an output signal having m/k times the frequency of the input signals may be provided. In some embodiments, by the selection in 111 a duty cycle of the generated signal may be adjusted.

According to some embodiments, the following examples are provided:

Example 1

A device, comprising:
a signal generator configured to generate a plurality of signals having different phases,
a selection circuit configured to select a plurality of signal pairs from the plurality of signals, and
a phase combiner circuit, wherein the phase combiner circuit is configured to generate a plurality of intermediate signals, each intermediate signal being based on one of the plurality of pairs such that a first signal of the respective pair determines rising edges of the respective intermediate signal and a second signal of the respective pair defines falling edges of the respective intermediate signal, and to combine the plurality of intermediate signals to form an output signal.

Example 2

The device of example 1, wherein rising edges of at least one intermediate signal of the plurality of intermediate signals correspond to rising edges of the first signal of the respective pair, and falling edges of the at least one intermediate signal correspond to rising edges of the second signal of the respective pair.

Example 3

The device of example 1 or 2, wherein the phase combiner circuit comprises a logic gate configured to combine the intermediate signals.

Example 4

The device of example 3, wherein the logic gate comprises an OR gate.

Example 5

The device of any one of examples 1-4, wherein the phase combiner circuit, for at least one of the pairs, comprises a flip-flop coupled to the selector circuit such that a first signal of the pair is provided to a first input of the flip-flop and a second signal of the pair is provided to a second input of the flip-flop.

Example 6

The device of example 5, wherein the flip-flop is a D flip-flop, the first input is a clock input and the second input is a reset input.

Example 7

The device of example 6, further comprising an inverter to provide the second signal to the reset input of the flip-flop.

Example 8

The device of example 6 or 7, further comprising an inverter coupled between an output of the flip-flop and a data input of the flip-flop.

Example 9

The device of example 6 or 7, wherein the device is configured to provide a value corresponding to a logic 1 to a data input of the flip-flop.

Example 10

The device of any one of examples 5-9, comprising a respective flip-flop for each of the pairs.

Example 11

The device of any one of examples 1-10, wherein said signal generator comprises at least one of a delay locked loop, a delay chain or a ring oscillator.

Example 12

The device of any one of examples 1-11, wherein said selection circuit comprises a multiplexer.

Example 13

The device of any one of examples 1-12, further comprising a frequency divider coupled to the output of the phase combiner circuit.

Example 14

A device, comprising:
a delay locked loop configured to provide a plurality of input signals having different phases based on a reference signal,
a multiplexer configured to select a at least one pair of signals from the plurality of input signals, for each of the at least one pair, a D flip-flop, wherein a clock input of the D flip-flop is configured to receive a first signal of the respective pair and a reset input of the D flip-flop is configured to receive a second signal of the respective pair via an inverter.

Example 15

The device of example 14, wherein the at least one pair comprises a plurality of pairs, wherein the device further comprises an OR gate coupled to outputs of the D flip-flops.

Example 16

The device of example 14 or 15, further comprising a frequency divider coupled to an output of the OR gate.

Example 17

A method, comprising:
providing multiple input signals having different phases,
selecting a plurality of signal pairs from the input signals, forming a plurality of intermediate signals, each intermediate signal based on one of the plurality of signal pairs, wherein each intermediate signal is formed such that rising edges of the respective intermediate signals are based on a first signal of the respective pair and falling edges of the respective intermediate signal are based on the second signal of the respective pair, and combining the intermediate signals.

Example 18

The method of example 17, wherein forming the plurality of intermediate signals comprises forming the intermediate signals such that the rising edges of each intermediate signal correspond to rising edges of the first signal of the respective signal pair and falling edges of the intermediate signal correspond to rising edges of the second signal of the respective signal pair.

Example 19

The method of example 17 or 18, further comprises frequency dividing the combined intermediate signals.

Example 20

The method of any one of examples 17-19, wherein selecting the pairs of input signals comprises selecting the pairs to adjust a duty cycle.

Example 21

The method of any one of examples 17-20, wherein the combined intermediate signal has a frequency corresponding to a frequency of each of the input signals multiplied by a number of selected pairs.

As can be seen from the plurality of variations and modifications described, the embodiments shown serve only as examples and are not to be construed as limiting in any way. For example, while in the devices shown at least two pairs of signals are selected to form at least two intermediate signals and the method of FIG. 10 m is at least two, in other embodiments only a single pair may be used, and the single intermediate signal thus formed may serve as an output signal (not circuit part to combine intermediate signals like an OR gate is necessary in such embodiments). In case of the method of FIG. 10, m may be equal to 1, and the combination of intermediate signals at 113 may be omitted in such an embodiment.

What is claimed is:

1. A device comprising:
a signal generator configured to generate a plurality of signals having different phases;
a selection circuit configured to select a plurality of signal pairs from the plurality of signals; and
a phase combiner circuit comprising a logic gate and configured to generate a plurality of intermediate signals, each intermediate signal being based on one of the plurality of signal pairs such that a first signal of the respective signal pair determines rising edges of the respective intermediate signal and a second signal of the respective signal pair defines falling edges of the respective intermediate signal,
wherein the logic gate is configured to combine the plurality of intermediate signals to form an output signal.

2. The device of claim 1, wherein rising edges of at least one intermediate signal of the plurality of intermediate signals correspond to rising edges of the first signal of the respective signal pair, and falling edges of the at least one intermediate signal correspond to rising edges of the second signal of the respective signal pair.

3. The device of claim 1, wherein the logic gate comprises an OR gate.

4. The device of claim 1, wherein the phase combiner circuit, for at least one of the signal pairs, comprises a flip-flop coupled to the selector circuit such that a first signal of the signal pair is provided to a first input of the flip-flop and a second signal of the signal pair is provided to a second input of the flip flop.

5. The device of claim 4,
wherein the flip-flop is a D flip-flop,
wherein the first input is a clock input, and
wherein the second input is a reset input.

6. The device of claim 5, further comprising an inverter to provide the second signal to the reset input of the flip-flop.

7. The device of claim 5, further comprising an inverter coupled between an output of the flip-flop and a data input of the flip-flop.

8. The device of claim 5, wherein the device is configured to provide a value corresponding to a logic 1 to a data input of the flip-flop.

9. The device of claim 4, further comprising a respective flip-flop for each of the signal pairs.

10. The device of claim 1, wherein the signal generator comprises at least one of a delay locked loop, a delay chain, or a ring oscillator.

11. The device of claim 1, wherein the selection circuit comprises a multiplexer.

12. The device of claim 1, further comprising a frequency divider coupled to the output of the phase combiner circuit.

13. A device comprising:
a delay locked loop configured to provide a plurality of input signals having different phases based on a reference signal;
a multiplexer configured to select a plurality of pairs of signals from the plurality of input signals;
for each of the plurality of pairs of signals, a D flip-flop, wherein a clock input of the D flip-flop is configured to receive a first signal of the respective pair of signals and a reset input of the D flip-flop is configured to receive a second signal of the respective pair of signals via an inverter; and
an OR gate coupled to outputs of the D flip-flops.

14. A method comprising:
providing multiple input signals having different phases;
selecting a plurality of signal pairs from the multiple input signals;
forming a plurality of intermediate signals, each intermediate signal based on one of the plurality of signal pairs, wherein each intermediate signal is formed such that rising edges of the respective intermediate signals are based on a first signal of the respective signal pair and falling edges of the respective intermediate signal are based on the second signal of the respective signal pair; and
combining, by a logic gate, the intermediate signals to form an output signal.

15. The method of claim 14, wherein forming the plurality of intermediate signals comprises forming the intermediate signals such that the rising edges of each intermediate signal correspond to rising edges of the first signal of the respective signal pair and falling edges of the intermediate signal correspond to rising edges of the second signal of the respective signal pair.

16. The method of claim 14, further comprising frequency dividing the combined intermediate signals.

17. The method of claim 14, wherein selecting the signal pairs of input signals comprises selecting the signal pairs to adjust a duty cycle.

18. The method of claim 14, wherein the combined intermediate signal has a frequency corresponding to a frequency of each of the input signals multiplied by a number of selected signal pairs.

19. The device of claim 1, wherein the combined intermediate signal has a frequency corresponding to a frequency of each of the input signals multiplied by a number of selected signal pairs.

20. The device of claim 1, wherein the combined intermediate signal has a duty cycle based on a selection of the plurality of signal pairs by the selection circuit.

\* \* \* \* \*